(12) United States Patent
Carlson

(10) Patent No.: US 7,989,695 B2
(45) Date of Patent: Aug. 2, 2011

(54) ORGANIC PHOTOVOLTAIC CELLS

(76) Inventor: Steven Allen Carlson, Cambridge, MA (US)

( * ) Notice: Subject to any disclaimer, the term of this patent is extended or adjusted under 35 U.S.C. 154(b) by 224 days.

(21) Appl. No.: 12/009,559

(22) Filed: Jan. 19, 2008

(65) Prior Publication Data

US 2008/0115833 A1    May 22, 2008

Related U.S. Application Data

(63) Continuation-in-part of application No. 11/640,781, filed on Dec. 18, 2006, now Pat. No. 7,715,095, which is a continuation-in-part of application No. 10/743,583, filed on Dec. 22, 2003, now Pat. No. 7,151,626, which is a continuation-in-part of application No. 10/024,060, filed on Dec. 18, 2001, now Pat. No. 6,724,512.

(51) Int. Cl.
*H01L 31/00* (2006.01)

(52) U.S. Cl. ...................................................... 136/263

(58) Field of Classification Search .................. 359/244, 359/240, 321; 252/582, 283, 587, 589; 136/252, 136/263
See application file for complete search history.

(56) References Cited

U.S. PATENT DOCUMENTS

| | | | |
|---|---|---|---|
| 4,164,431 A | 8/1979 | Tang | |
| 4,281,053 A | 7/1981 | Tang | |
| 5,009,958 A | 4/1991 | Yamashita et al. | |
| 5,171,373 A | 12/1992 | Hebard et al. | |
| 5,185,208 A | 2/1993 | Yamashita et al. | |
| 5,201,961 A | 4/1993 | Yoshikawa et al. | |
| 5,206,388 A * | 4/1993 | Alder | 549/31 |
| 5,331,183 A | 7/1994 | Sariciftci et al. | |
| 5,366,252 A * | 11/1994 | Nishida et al. | 283/94 |
| 5,470,505 A | 11/1995 | Smith et al. | |
| 5,482,570 A | 1/1996 | Saurer et al. | |
| 5,482,822 A * | 1/1996 | Mihara et al. | 430/270.14 |
| 5,885,368 A | 3/1999 | Lupo et al. | |
| 5,999,780 A * | 12/1999 | Mort et al. | 399/266 |
| 6,084,176 A | 7/2000 | Shiratsuchi et al. | |
| 6,198,091 B1 | 3/2001 | Forrest et al. | |
| 6,340,789 B1 | 1/2002 | Petritsch et al. | |
| 6,452,092 B2 | 9/2002 | Han et al. | |
| 6,475,590 B1 * | 11/2002 | Kitayama et al. | 428/64.8 |
| 6,724,512 B2 | 4/2004 | Carlson et al. | |
| 6,812,399 B2 | 11/2004 | Shaheen et al. | |
| 6,858,158 B2 * | 2/2005 | Chittibabu et al. | 252/183.11 |
| 6,861,722 B2 | 3/2005 | Graetzel et al. | |
| 6,900,382 B2 | 5/2005 | Chittibabu et al. | |
| 6,950,228 B2 | 9/2005 | Carlson et al. | |
| 7,026,103 B2 * | 4/2006 | DeVoe et al. | 430/333 |
| 7,042,029 B2 | 5/2006 | Graetzel et al. | |
| 7,132,598 B2 | 11/2006 | Nelles et al. | |
| 7,180,110 B2 | 2/2007 | Komatsu et al. | |

* cited by examiner

*Primary Examiner* — Ricky L. Mack
*Assistant Examiner* — Tuyen Q Tra

(57) ABSTRACT

The present invention pertains to organic infrared absorbing layers comprising an organic radical cation compound that absorbs in an infrared region and produces an electron transfer reaction that results in a flow of electrons. Preferably, the organic radical cation compound is a salt of an aminium radical cation. Provided are photovoltaic cells comprising such light-sensitive organic infrared absorbing layers.

14 Claims, No Drawings

US 7,989,695 B2

ORGANIC PHOTOVOLTAIC CELLS

RELATED APPLICATIONS

This application is a continuation-in-part of U.S. patent application Ser. No. 11/640,781, filed Dec. 18, 2006, now U.S. Pat. No. 7,715,095 which is a continuation-in-part of U.S. patent application Ser. No. 10/743,583, filed Dec. 22, 2003, now U.S. Pat. No. 7,151,626, which is a continuation-in-part of U.S. patent application Ser. No. 10/024,060, filed Dec. 18, 2001, now U.S. Pat. No. 6,724,512, all to the common assignee, the disclosures of which related applications are fully incorporated herein in their entirety for all purposes.

FIELD OF THE INVENTION

The present invention relates generally to the field of organic infrared absorbing layers, and particularly, pertains to light-sensitive organic infrared absorbing layers that provide a photon-induced electron transfer reaction. More specifically, this invention pertains to photovoltaic cells and other optical devices comprising such organic infrared absorbing layers.

BACKGROUND OF THE INVENTION

Throughout this application, various patents are referred to by an identifying citation. The disclosures of the patents referenced in this application are hereby incorporated by reference into the present disclosure to more fully describe the state of the art to which this invention pertains.

There is a rapidly growing worldwide need for renewable energy sources to replace our dependence on energy from fossil fuels which are becoming increasingly expensive and unstable in supply and which produce carbon dioxide emissions that promote global warming. Among the various renewable energy sources, photovoltaic or solar cells are particularly attractive because of their potential to capture the extremely large amounts of energy from the sun and convert it to electricity to meet much of the world's need for energy. Also, photovoltaic energy sources do not emit carbon dioxide and thus help to abate the global warming trend.

Organic photovoltaic cells are one of the options to supplement or replace silicon and other inorganic photovoltaic cells that are relatively expensive and generally are limited to rigid, high cost designs. One of the general features of organic photovoltaic cells is their lower cost due to the ability to coat them economically on flexible substrates and their resulting flexible designs that will be easier and less expensive to integrate into buildings, clothing, and other substrates where energy capture, storage, and usage are desirable. For general commercial acceptance based on cost and other factors, the threshold value of solar energy conversion efficiency for organic photovoltaics is estimated to be about 8%, compared to about 15% for silicon photovoltaics.

Various technical approaches have been taken to make organic photovoltaic cells, such as for example illustrated by U.S. Pat. No. 5,171,373 to Hebard et al.; U.S. Pat. No. 5,331,183 to Sariciftci et al.; U.S. Pat. No. 5,470,505 to Smith et al.; U.S. Pat. No. and 5,885,368 to Lupo et al. These approaches generally involve at least one active layer that comprises a photon-absorbing organic compound that acts as an electron donor upon the absorption of a photon and leads to the flow of electrical current in the photovoltaic cell. Typically, these photon-absorbing organic compounds absorb in the ultraviolet and visible region of the sun's spectrum, but do not significantly absorb in the infrared portion of the sun's spectrum.

Since about 50% of the sun's energy is in the infrared part of the solar spectrum, it would be advantageous if an organic photovoltaic cell were available that would convert infrared photons to electricity

SUMMARY OF THE INVENTION

This invention pertains to infrared absorbing layers that provide a photon-induced electron transfer reaction resulting in a flow of electrons and to photovoltaic cells and other optical devices comprising such infrared absorbing layers. Preferably the infrared absorbing material in the photon-induced electron transfer layer comprises a non-polymeric organic radical cation compound.

One aspect of this invention pertains to a photovoltaic cell comprising an infrared absorbing layer, wherein the infrared absorbing layer comprises a non-polymeric organic radical cation compound that absorbs in an infrared region and produces an electron transfer reaction that results in a flow of electrons. In one embodiment, the radical cation compound is a salt of an aminium radical cation. In one embodiment, the radical cation compound is a salt of a tetrakis(phenyl)-1,4-benzenediamine radical cation. In one embodiment, the radical cation compound is a salt of a tris(phenyl)-aminium radical cation. In one embodiment, the electron transfer reaction is a one-electron oxidation of the radical cation compound. In one embodiment, the infrared region is from 800 nm to 2000 nm. In one embodiment, the electron transfer reaction is reversible. In one embodiment, the radical cation compound is electrically conductive.

In one embodiment of the photovoltaic cells of the present invention, the photovoltaic cell further comprises a layer of an inorganic photovoltaic material.

In one embodiment of the photovoltaic cells of this invention, the radical cation compound is complexed to an inorganic oxide layer, preferably to a titanium oxide layer. In a preferred embodiment, the radical cation compound is complexed to a first anionic group of an anionic compound and the anionic compound is complexed by a second anionic group of the anionic compound to the inorganic oxide layer. In one embodiment, the electron transfer reaction is an one-electron oxidation of the radical cation compound. In one embodiment, the electron transfer reaction is reversible.

One embodiment of the photovoltaic cells of the present invention that convert sunlight of wavelengths above 800 nm to electricity is a photovoltaic cell comprising an aminium radical cation compound as a photon-induced electron donor. In one embodiment, the radical cation compound is non-polymeric. In one embodiment, the radical cation compound is selected from the group consisting of a salt of a tetrakis(phenyl)-1,4-benzenediamine radical cation and a salt of a tris(phenyl)-aminium radical cation.

Another embodiment of the photovoltaic cells of this invention is the photovoltaic cell comprising a non-polymeric organic radical cation compound as a photon-induced electron donor material, wherein the organic radical cation compound is selected from the group consisting of a salt of a tetrakis(phenyl)-1,4-benzenediamine radical cation and a salt of a tris(phenyl)-aminium radical cation.

As will be appreciated by one of skill in the art, features of one aspect or embodiment of the invention are also applicable to other aspects or embodiments of the invention.

DETAILED DESCRIPTION OF THE INVENTION

The photovoltaic cells of the present invention provide capture of the sun's energy across a wide range of wavelengths, particularly including wavelengths in the near infrared region above 800 nm and higher.

Organic Free Radical Compounds

The term "organic free radical compound," as used herein, pertains to an organic compound which comprises at least one free unpaired electron on an atom, such as, for example, a carbon atom, a nitrogen atom, or an oxygen atom, in the ground state of the organic compound. Suitable organic free radical compounds for the photovoltaic cells and other optical devices of the present invention include neutral organic free radicals, salts of organic free radical cations, and salts of organic free radical anions. For purposes of brevity, the terms "organic free radical compound" and "organic radical compound" are used interchangeably herein. For purposes of brevity, the terms "organic free radical cation," "organic radical cation," and "radical cation" are used interchangeably herein. The word "cation," as used herein, pertains to a positively charged atom in a molecule, such as, for example, a positively charged nitrogen atom. Similarly, the terms "organic free radical anion," "organic radical anion," and "radical anion" are used interchangeably herein. The word "anion," as used herein, pertains to a negatively charged atom in a molecule, such as, for example, a negatively charged oxygen atom. It should be noted that the free unpaired electron and the positive and negative charges of the organic free radical compounds may be localized on a single atom or shared among more than one atom.

Examples of suitable salts of organic free radical cations for the photovoltaic cells and other optical devices of this invention include, but are not limited to, salts of aminium radical cations, such as, for example, tris (p-dibutylaminophenyl) aminium hexafluoroantimonate, which is commercially available as IR-99, a trade name for a dye available from Sperian in Smithfield, R.I. An equivalent chemical name for IR-99, used interchangeably herein, is the hexafluoroantimonate salt of N,N-dibutyl-N',N'-bis[4-(dibutylamino)phenyl]-1,4-benzenediamine radical cation. IR-99 is known to be a stable material that may exist in a layer of material, such as in a polymeric coating, under normal room conditions for an extended period of time. Other suitable salts of aminium radical cations include IR-126 and IR-165, which are trade names for dyes available from Sperian in Smithfield, R.I. These two dyes are likewise known to be stable in the dry powder form and in a layer of material, such as in a polymer-containing coating, under ambient room conditions for extended periods of time, such as for many years.

IR-126, which is the hexafluoroantimonate salt of tetrakis [4-(dibutylamino)phenyl]-1,4-benzenediamine radical cation, is particularly preferred for use in light-sensitive infrared absorbing layers in the photovoltaic cells and other optical devices of this invention because of its very intense absorption across the 750 to 1750 nm wavelength region that represents about 40% of the sun's energy that is incident on the earth and because of its photon-induced one-electron oxidation to a IR-165 type diradical dication compound. This one-electron oxidation of IR-126 also produces an electron transfer to an acceptor material and can be made reversible, as is required for cost effective operation of photovoltaic cells. This photon-induced electron donor property is useful for various types of organic photovoltaic cells, including the types described in the aforementioned U.S. patents to Hebard et al., Saricifti et al., Smith et al., and Lupo et al.

Optical Photovoltaic Cells and Other Optical Devices

One aspect of the present invention pertains to a photovoltaic cell comprising an organic free radical compound in which the free radical compound forms an oxidized or a reduced product having a change in absorption and/or reflectivity in a visible and/or a near-infrared wavelength region as a result of a photon-induced and/or electric current-induced reaction of the free radical compound, preferably an photon-induced electron transfer reaction of the free radical compound.

One aspect of this invention pertains to a photovoltaic cell comprising an infrared absorbing layer, wherein the infrared absorbing layer comprises a non-polymeric organic radical cation compound that absorbs in an infrared region and produces an electron transfer reaction that results in a flow of electrons.

The terms "near-infrared wavelength region," "near-infrared wavelength," "near-infrared," and "infrared," as used interchangeably herein, pertain to wavelengths from 700 nm to 2000 nm. In one embodiment, the free radical compound is a salt of an organic radical cation, preferably a salt of an aminium radical cation, and more preferably a salt of an aminium radical cation selected from the group consisting of a salt of a tetrakis(phenyl)-1,4-benzenediamine radical cation and a salt of a tris(phenyl)-aminium radical cation. Most preferably, the radical cation is tris (p-dibutylaminophenyl) aminium hexafluoroantimonate. In a preferred embodiment, the free radical compound is a salt of a tetrakis[4-dialkylamino)phenyl]-1,4-benzenediamine radical cation, such as, for example, the hexafluoroantimonate salt of tetrakis[4-(dibutylamino)phenyl]-1,4-benzenediamine radical cation. Besides n-butyl groups, other suitable alkyl groups include any of the alkyl groups, such as, for example, methyl, ethyl, 2-propyl, n-pentyl, and n-hexyl, and combinations thereof.

The infrared absorbing layer of the present invention may be utilized in a variety of product applications. In one embodiment, the infrared absorbing layer is utilized in a photovoltaic cell.

In one embodiment of the photovoltaic cell of the present invention, the electron transfer reaction, whether induced by photons, by applying an electric current, or thermally, is an oxidation or a reduction of the organic free radical compound. Suitable electron transfer reactions include, but are not limited to, an one-electron oxidation of the free radical compound, a two-electron oxidation of the free radical compound, an one-electron reduction of the free radical compound, and a two-electron reduction of the free radical compound. For example, the oxidation product of a radical cation compound may be a diradical dication which may readily undergo reverse electron transfer reactions to regenerate the radical cation In one embodiment, the wavelength range of the photons to form the electron-transfer reaction product comprises one or more ultraviolet wavelengths. In one embodiment, the wavelength range of the photons to form the reaction product comprises one or more wavelengths from 400 to 700 nm. In one embodiment, the wavelength range of the photons to form the reaction product comprises one or more wavelengths from 700 to 2000 nm.

In one embodiment of the photovoltaic cell of the present invention, the photon-induced electron transfer reaction is induced by ultraviolet radiation. In one embodiment, the photon-induced electron transfer is induced by visible radiation, and preferably is induced by near-infrared radiation. In one embodiment, the photon-induced electron transfer reaction is induced by absorption of photons by a free radical ground state of the free radical compound. This is particularly important where the excited states of the free radical moiety ground state of the free radical compound can not be efficiently populated by absorption by a non-free radical ground state, such as, for example, by an aromatic moiety ground state, and by its subsequent internal conversion to a lower excited state related to the free radical moiety ground state.

A wide variety of organic free radical compounds, such as various neutral free radicals, salts of radical cations, and salts of radical anions, may be utilized in the photovoltaic cells of the present invention. Particular advantages for the use of organic free radical compounds in the photovoltaic cells and other optical devices of this invention include, but are not limited to, their extremely intense infrared absorptions and/or reflectivities at the desired wavelengths for optical Internet and other applications such as solar energy conversion; their large absorption and/or reflectivity changes over a broad range of wavelengths; their extremely transparent and non-reflective states in the infrared when switched by the transfer of one or more electrons by the absorption of photons, by applying an electric current, and thermally; their unique ultra-high speed photon conversions at as fast as sub-picosecond times; their stability to degradation by heat, light, or ambient conditions of moisture and air; their ease of fabrication by, for example, coating or plastic molding; and their non-toxicity.

For example, IR-165 and IR-126 are illustrative of one type of the organic free radical compounds for the photovoltaic cells and other optical devices of this invention and may be reversibly formed in a photon-induced one electron transfer reaction, where IR-126 is the one-electron reduction product of IR-165 and, conversely, IR-165 is the one-electron oxidation product of IR-126. IR-126 has a very high molar extinction coefficient of about 40,000 liters/mole-cm in a broad and relatively flat absorption across the 1530 to 1620 nm wavelength range, as well as absorbing at about this same molar extinction coefficient down to about 900 nm and also absorbing out to above 2000 nm.

While not wishing to be bound by any particular theory, the unique ultra-high speed photon conversions of the organic free radical compounds, such as at sub-picosecond speeds, are thought to be greatly influenced by the unique free radical character of their ground states and perhaps of their excited states.

In a preferred embodiment, the absorption of the photons by the organic free radical compound is from a free radical ground state of the free radical compound, and more preferably, the wavelength of the photons absorbed by the free radical ground state is one or more near-infrared wavelengths from 700 to 2000 nm.

Suitable salts of organic radical cations for the photovoltaic cells and other optical devices of this invention include, but are not limited to, salts of an aminium radical cation. The choice of the counteranion for the salt depends on a variety of factors such as, for example, the desired speed of the photon-induced reaction to form the reaction product from the organic free radical compound, the desired speed of the reverse reaction of the reaction product to regenerate the starting organic free radical compound, and the required stability of any photon-absorbing layers against degradation by oxygen, moisture, and photon exposures and against possible side reactions in switching during the operation of the reversible photovoltaic cell.

For example, the photon-absorbing layer may comprise IR-126 or a similar aminium radical cation and the photon-absorbing layer may comprise an oxidative, electron-accepting matrix of polymers, counteranions, and other additives around the aminium radical cation. Upon imaging of this optical shutter by photons, for example, at 980 nm, the IR-126 type aminium radical cation forms a reaction product, such as an one-electron oxidation product that is the same or similar to IR-165.

In one embodiment of the photovoltaic cells of this invention, the reaction product forms in less than 1 nanosecond after the absorption of the photons by the organic free radical compound, preferably forms in less than 0.1 nanoseconds after the absorption of the photons, more preferably forms in less than 0.01 nanoseconds after the absorption of the photons, and most preferably forms in less than 0.001 nanoseconds after absorption of photons by the free radical compound.

In one embodiment of the photovoltaic cells and other optical devices of this invention, the reaction product is an oxidation product of the organic free radical compound, such as, for example, an one-electron oxidation product or a two-electron oxidation product. IR-126 as the organic free radical compound and IR-165 as the reaction product is an example of the reaction product being an one-electron oxidation product. In one embodiment, the reaction product is a reduction product of the organic free radical compound, such as, for example, an one-electron reduction product and a two-electron reduction product. IR-165 as the organic free radical compound and IR-126 as the reaction product is an example of the reaction product being an one-electron reduction product. IR-126 as the free radical compound and its corresponding non-free radical amine as the reaction product is another example of the reaction product being an one-electron reduction product.

In addition to the organic free radical compound, the photon-absorbing layer of the photovoltaic cells and other optical devices of the present invention may comprise other materials to provide increased mechanical integrity to the layer and to optimize the formation of the reaction product and the reverse reaction to regenerate the starting organic free radical compound. Suitable materials for the photon-absorbing layer include, but are not limited to, organic polymers such as polycarbonate and cellulosic polymers; inorganic glasses, such as a porous grade of silica glass as known in the art of inorganic glasses; and one or more inorganic xerogel layers, as known in the art of xerogel layers. Because of the small sizes possible for the photovoltaic cells and other optical devices of this invention, organic polymers and inorganic xerogel layers are preferred because, unlike inorganic glasses, they are known to be readily fabricated in layers with thicknesses of less than 8 microns by coating and other deposition processes known in the art of manufacturing layers with thicknesses of 0.1 to 8 microns. The one or more inorganic xerogel layers typically have a nanoporous structure with average pore diameters in the range of 0.5 to 300 nm, which may be utilized advantageously to be filled partly or completely with the organic free radical compound and other materials, such as polymeric materials, electron-accepting compounds, and electron-donating compounds, to provide a nanocomposite photon-absorbing layer.

The organic nature of the organic free radical compounds and of the photovoltaic cells of the present invention is advantageous for ease of fabrication, such as by conventional methods of coating or plastic molding, in comparison to the more difficult fabrication with inorganic glass or inorganic semiconductor materials typically used in photovoltaic cells and other optical devices.

Due to the excellent absorption, reflectance, ease of switching by a simple electron transfer reaction by either absorption of photons or by the application of an electric current to provide electrons or take them away, and other properties of organic free radical compounds, a wide range of photovoltaic cells and other optical devices may be made that comprise organic free radical compounds, as described herein. Because of the many superior properties of the organic free radical compounds, such as their opacity and reflectance in one state and their transparency and non-reflectance in a second state when their switching is induced by absorbing photons, by applying an electric current to provide electrons to and to take them away from free radical compounds and their electron transfer reaction products, thermally, or by some other external energy source, there are many combinations of one or more organic free radical compounds in one or more layers, areas, or sections of optical devices that may be used to achieve the desired properties in a wide range of optical devices, including photovoltaic cells. This disclosure covers some specific and general embodiments and examples of the use of organic free radical materials to make photovoltaic cells and other optical devices, but it will be apparent to one skilled in the art that a wide range of combinations, changes, and modifications can be made therein without departing from the spirit and scope thereof.

Preferred organic free radical compounds for the photovoltaic cells and other optical devices of this invention are salts of aminium compounds, and more preferably, salts of aminium radical cations. More preferred organic free radical compounds for the photovoltaic cells and other optical devices of this invention are non-polymeric organic free radical compounds, such as salts of aminium radical cations. Most preferred organic free radical compounds are salts of tris (4-dialkylaminophenyl) aminium radical cations and salts of tetrakis [4-(dialkylamino)phenyl]-1,4-benzenediamine radical cations.

Chart 1 shows the chemical structure of IR-99, a representative free radical compound for the infrared absorbing elements of this invention. IR-99 is an example of a salt of a tris (4-dialkylaminophenyl) aminium radical cation.

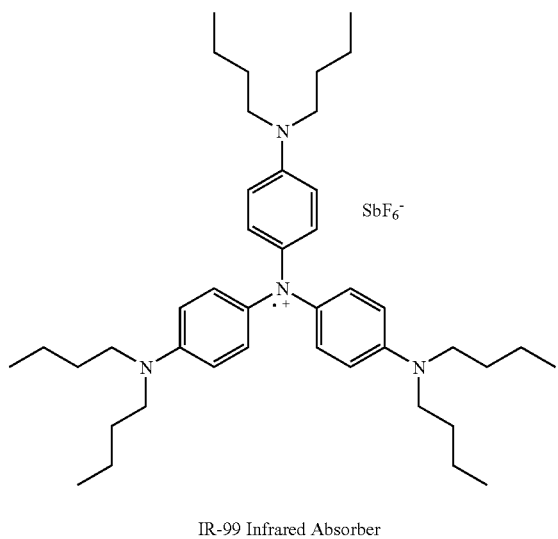

Chart 1

IR-99 Infrared Absorber

It can be seen in Chart 1 that IR-99 is an organic free radical compound with a single free electron shown on one of the nitrogen atoms. It is present in a salt form with a hexafluoroantimonate anion in this case.

In basic terms, in the optical devices of this invention, only electrons need to move. Thus, the optical devices of this invention are solid state devices with no moving parts, unless optional moving parts are desired for some reason. Also, since the switching of the organic free radical compounds, such as aminium free radical compounds, may involve only the addition or removal of electrons and can be induced with photons as well as by the application of an electric current, the wide variety of processes for reversibly imaging the optical devices that utilize these optical shutters or switches of this invention is evident. These include, but are not limited to, reversible switching by photons, preferably photons of different wavelengths for each direction (reduction or oxidation) of switching; photons to switch in one direction and a thermal or "dark" reaction to switch back in the other direction; and by the addition and removal of electrons by the application of an electric current at an appropriate voltage.

Since the absorption of photons by the free radical compounds, such as, for example, by aminium compounds, may result in a photon-induced electron transfer reaction, optical devices comprising organic free radical compounds may also be utilized in many other applications where a photon-induced flow of electrons is critical. Examples of these other applications include, but are not limited to, photodetectors to convert an incoming optical signal into an electrical signal, for example, either to measure the intensity of the optical signal or to do an optical-to-electrical conversion, as known in the art of fiber optic communication systems; and solar cells where the incident sunlight is converted into an electrical current, as known in the art of photovoltaic solar cells. For solar cells, organic free radical compounds, such as salts of aminium radical cations, are advantageous for their intense absorption of sunlight above 800 nm and out to wavelengths over 2000 nm, which are infrared wavelength regions where conventional inorganic photovoltaics, such as silicon solar cells, are very inefficient in collecting the incident solar radiation. For solar cells, the organic free radical compounds may be used in combination with other organic free radical compounds and/or with inorganic and other known photovoltaics to achieve the optimum efficiency of solar energy conversion. For example, a layer comprising an organic free radical compound may be deposited over a layer of an inorganic photovoltaic material to provide a solar cell with increased solar energy conversion efficiency and also durability, since the organic free radical compounds, such as the salts of aminium radical cations, may be utilized as stabilizing materials, such as is known in the art of optical disks such as DVD disks.

Also, the photon-induced electron transfer reactions of organic free radical compounds, such as, for example, salts of aminium compounds, may be utilized for dye-sensitized splitting of water, as known in the art of solar energy conversion to form hydrogen from water. The extended absorption range of the organic free radical compounds in the infrared range that is useful in photovoltaic solar cells is also useful for this aspect of solar energy conversion that involves splitting water to form hydrogen. The organic free radical compounds may be utilized alone or in combination with other organic free radical compounds or other non-free radical dyes to sensitize the splitting of water, especially to provide efficient absorption of the solar radiation in the visible region where many of the organic free radical compounds do not have the broad, intense absorptions that they have in the infrared and ultraviolet wavelength regions. One aspect of this involves complexing of the one or more sensitizing dyes to an inorganic oxide layer such as a titanium oxide sol gel. Since the inorganic oxide layers are typically positively charged, anionic sensitizing dyes and other anionic compounds will complex readily, but typically the radical cation compounds can only be complexed by first complexing an anionic compound with excess anions to the inorganic oxide layer and then complexing the positively charged radical cation compounds to the excess anions that are still available from the complexed anionic compound.

Also, since organic free radical compounds, such as, for example, salts of aminium radical cations, may be converted from one distinct state to another by the addition or removal of an electron, they may be utilized in electrical devices where electrons are stored and then removed. Preferred organic free radical compounds in such electrical devices are non-polymeric organic free radical compounds which are monomeric with no repeating moiety in their chemical structure, such as, for example, salts of aminium radical cations such as, for example, IR-99 and IR-126. Besides providing stable materials to which to add or remove an electron to form other typically stable materials, many of the organic free radical compounds, particularly the anion radical salts and cation radical salts, have some level of electrically conductive properties in the free radical state and become non-conductive when reversibly converted to a non-free radical state. Where the electrical conductivity of the organic free radical compounds in any of their switched states, before or after the application of an electrical current, is not sufficient by itself to provide the desired efficiency and speed of switching, other electrically conductive materials may be added to the active layer of the electrically-driven devices comprising an organic free radical compound to promote the desired electrically-induced reaction. Examples of suitable electrically conductive materials to add to the devices comprising an organic free radical compound include, but are not limited to, vanadium (V) oxide, vanadium (IV) oxide, antimony-doped tin oxide, indium-doped tin oxide, sulfonated polystyrenes, and polydioxythiophenes. Also, the voltages and current required to electrically induce switching in the organic free radical compounds are typically very low, such as 1 to 4 volts or less at a low current.

Thus, electrical devices comprising organic free radical compounds, particularly comprising salts of aminium compounds, may be utilized in a variety of electrical devices including, but not limited to, batteries and single electron transistors. Due to the ability of the organic free radical compounds to generally operate effectively in submicron sizes, they may be utilized for quantum well, quantum dot, and quantum wire configurations for single electron transistors and for other electrical devices, such as, for example, submicron devices as described in U.S. Pat. No. 6,121,075 to Yamashita; U.S. Pat. No. 6,204,517 to Wu; U.S. Pat. No. 6,211,013 to Park, et al.; U.S. Pat. No. 6,221,720 to Fukuda; and U.S. Pat. No. 6,307,422 to Roesner, et al. The organic free radical compounds, such as, for example, the non-polymeric organic free radical compounds such as the salts of aminium radical cations, with their reversible electrochemistry and electroactive properties may be utilized in battery electrodes, such as, for example, in positive electrodes with a negative electrode comprising lithium. The anion of the organic free radical cation compound may be changed to provide an anion with increased electroactive properties in order to greatly increase the energy density in the battery. For example, the hexafluoroantimonate anion of IR-165 could be replaced with an electroactive polysulfide anion, $S_x^{2-}$, where x is an integer greater than 2.

Also, since the reduction and oxidation of the organic free radical compounds may be induced by the absorption of photons, one aspect of the batteries comprising an organic free radical compound, preferably non-polymeric organic free radical compounds such as salts of aminium cations, pertains to a battery that may be recharged by exposure to photons, such as from the incident solar radiation, to provide a solar rechargeable battery.

While the invention has been described in detail and with reference to specific and general embodiments thereof, it will be apparent to one skilled in the art that various changes and modifications can be made therein without departing from the spirit and scope thereof.

The invention claimed is:

1. A photovoltaic cell comprising an infrared absorbing layer, wherein said infrared absorbing layer comprises a non-polymeric organic radical cation compound that absorbs in an infrared region and produces an electron transfer reaction that results in a flow of electrons, and wherein said radical cation compound is a salt of a tetrakis(phenyl)-1,4-benzenediamine radical cation.

2. The photovoltaic cell of claim 1, wherein said electron transfer reaction is an one-electron oxidation of said radical cation compound.

3. The photovoltaic cell of claim 1, wherein said infrared region is from 800 nm to 2000 nm.

4. The photovoltaic cell of claim 1, wherein said electron transfer reaction is reversible.

5. The photovoltaic cell of claim 1, wherein said radical cation compound is electrically conductive.

6. The photovoltaic cell of claim 1, wherein said photovoltaic cell further comprises a layer of an inorganic photovoltaic material.

7. The photovoltaic cell of claim 1, wherein said radical cation compound is complexed to an inorganic oxide layer.

8. The photovoltaic cell of claim 7, wherein said radical cation compound is complexed to a first anionic group of an anionic compound, and wherein said anionic compound is complexed by a second anionic group of said anionic compound to said inorganic oxide layer.

9. The photovoltaic cell of claim 7, wherein said electron transfer reaction is an one-electron oxidation of said radical cation compound.

10. The photovoltaic cell of claim 7, wherein said electron transfer reaction is reversible.

11. The photovoltaic cell of claim 1, wherein said radical cation compound is complexed to a titanium oxide layer.

12. The photovoltaic cell of claim 11, wherein said radical cation compound is complexed to a first anionic group of an anionic compound, and wherein said anionic compound is complexed by a second anionic group of said anionic compound to said titanium oxide layer.

13. The photovoltaic cell of claim 11, wherein said electron transfer reaction is an one-electron oxidation of said radical cation compound.

14. A photovoltaic cell that converts sunlight of wavelengths above 800 nm to electricity, wherein said photovoltaic cell comprises an aminium radical cation compound as a photon-induced electron donor, and wherein said radical cation compound is selected from the group consisting of a salt of a tetrakis(phenyl)-1,4-benzenediamine radical cation and a salt of a tris(phenyl)-aminium radical cation.

* * * * *